United States Patent [19]

Hashimoto

[11] Patent Number: 4,652,900
[45] Date of Patent: Mar. 24, 1987

[54] NPN TRANSISTOR WITH P/N CLOSED LOOP IN CONTACT WITH COLLECTOR ELECTRODE

[75] Inventor: Masaru Hashimoto, Ayase, Japan

[73] Assignee: Tokyo Shibaura Denki Kabushiki Kaisha, Kawasaki, Japan

[21] Appl. No.: 753,280

[22] Filed: Jul. 9, 1985

Related U.S. Application Data

[63] Continuation of Ser. No. 361,086, Mar. 23, 1982.

[30] Foreign Application Priority Data

Mar. 30, 1981 [JP] Japan .................................. 56-46905

[51] Int. Cl.⁴ .................... H01L 29/06; H01L 27/04; H01L 29/72
[52] U.S. Cl. ....................................... 357/34; 357/20; 357/48; 357/86
[58] Field of Search ....................... 357/86, 34, 20, 48, 357/52

[56] References Cited

U.S. PATENT DOCUMENTS

| | | | |
|---|---|---|---|
| 3,590,345 | 6/1971 | Brewer et al. | 357/86 |
| 3,676,714 | 7/1972 | Wensink et al. | 357/86 |
| 3,878,551 | 4/1975 | Callahan, Jr. | 357/86 |
| 4,027,325 | 5/1977 | Genesi | 357/86 |
| 4,117,507 | 9/1978 | Pacor | 357/86 |
| 4,236,164 | 11/1980 | Tang et al. | 357/34 |
| 4,276,556 | 6/1981 | Enomoto et al. | 357/86 |
| 4,303,932 | 12/1981 | Johannsen | 357/86 |

OTHER PUBLICATIONS

Berger et al., "Speed Enhancement of Saturated Transistors" IBM Tech. Disc. Bull., vol. 20, No. 2, pp. 636–637, Jul. 1977.

Primary Examiner—J. Carroll
Attorney, Agent, or Firm—Finnegan, Henderson, Farabow, Garrett & Dunner

[57] ABSTRACT

A semiconductor device capable of suppressing the influence of a parasitic pnp transistor caused when an npn transistor operates in saturation range in such a way that a p-type impurity region is formed in the outer layer of an n-type collector region and electrically short-circuited with the n-type collector region isolated by a p-type isolation diffusion layer in the npn bi-polar transistor.

1 Claim, 9 Drawing Figures

NPN TRANSISTOR WITH P/N CLOSED LOOP IN CONTACT WITH COLLECTOR ELECTRODE

This is a continuation of application Ser. No. 361,086, filed Mar. 23, 1982.

BACKGROUND OF THE INVENTION

The present invention relates to a semiconductor device and, more particularly, a semiconductor device provided with a bi-polar transistor of npn type.

FIG. 1A is a plane view showing a typical conventional bi-polar transistor of npn type employed in the semiconductor integrated circuit device and FIG. 1B is a sectional view taken along a line B—B in FIG. 1A.

Reference numeral 1 represents a p-type silicon substrate. An epitaxial silicon layer of $n^-$-type is formed on the p-type silicon substrate 1. An isolation diffusion layer 2 is formed in the epitaxial silicon layer, in contact with the p-type silicon substrate 1. An $n^-$-type collector region 3 of npn bi-polar transistor is isolated by this isolation diffusion layer 2. An $n^+$-type buried layer 4 is formed between the $n^-$-type collector region 3 and the p-type silicon substrate 1. On the other hand, an $n^+$-type region 7 for forming a collector electrode and a $p^+$-type base region 5 are formed adjacent to the upper portion of $n^-$-type collector region 3. An $n^+$-type emitter region 6 is formed adjacent to the upper portion of $p^+$-type base region 5.

The upper surface of the epitaxial layer is covered by an insulating film (not shown). On the insulation film are formed emitter, base and collector electrodes which are ohmic-contacted through a contact hole with the $n^+$-type emitter region 6, $p^+$-type base region 5 or $n^+$-type region 7.

It is well-known that with a bi-polar transistor having a construction as described above, the storage of minority carriers (or holes in the case) occurs at the $n^-$-type collector region 3 when the transistor is operated in the saturation range (which typically happens when the collector electrode is opened and base current is flowed from the $p^+$-type base region 5 to the $n^+$-type emitter region 6). As a result, this minority carrier storage acts as a trigger, causing a parasitic transistor of pnp type, which comprises the $p^+$-type base region 5, $n^-$-type collector region 3, p-type substrate 1 and $p^+$-type isolation diffusion layer 2, to be operated, said $p^+$-type base region 5 functioning as an emitter, $n^-$-type collector rgion 3 as a base, and p-type substrate 1 and $p^+$-type isolation layer 2 as a collector. The occurrence of this parasitic pnp transistor lowers the reliability of the device depending upon its location in the intergrated circuit.

Therefore, a construction shown in FIGS. 2A and 2B has been employed to suppress the influence of a pnp type parasitic transistor caused in a typical npn type bi-polar transistor. FIG. 2A is a plane view similar to FIG. 1A and showing this improved npn type bi-polar transistor, and FIG. 2B is a sectional view taken along a line B—B in FIG. 2A. The same portions as those in FIGS. 1A and 1B are represented by the same reference numerals.

In the case of this improved npn transistor, an $n^+$-type guard ring 7' is formed in the upper portion of $n^-$-type collector region 3, enclosing the $p^+$-type base region 5. Guard ring 7' also functions as the $n^+$-type region 7 for forming the collector electrode as in FIGS. 1A and 1B. Thanks to this $n^+$-type guard ring 7', $h_{FE}$ (forward current gain) of the common emitter configuration parasitic pnp transistor is lowered and less current is allowed to flow to the p-type substrate 1 as compared with the npn transistor shown in FIGS. 1A and 1B.

In the case where the improved npn transistor shown in FIGS. 2A and 2B and the npn transistor shown in FIGS. 1A and 1B are manufactured on a same standard, the distance between the $n^+$-type guard ring 7' and the $p^+$-type isolation diffusion layer 2 in the improved npn transistor must be made same as between the $p^+$-type base region 5 and the $p^+$-type isolation diffusion layer 2 in the transistor shown in FIGS. 1A and 1B. In the case of the improved npn transistor shown in FIGS. 2A and 2B, therefore, the width of $n^-$-type collector region 3, that is, the base width of the parasitic pnp transistor is substantially enlarged. Since $h_{FE}$ of the bi-polar transistor becomes smaller as its base width becomes larger, $h_{FE}$ of the parasitic pnp transistor is further lowered because the width of n-type collector region 3 is substantially enlarged in the improved npn transistor.

Even in the case of the improved npn transistor, however, the operation of the parasitic pnp transistor causes relatively large current to flow to the p-type substrate 1 and the problem of reliability caused by this current is still left unsolved.

SUMMARY OF THE INVENTION

The object of the present invention is to provide a semiconductor device such as integrated circuit provided with an npn type bi-polar transistor and capable of suppressing the influence of a parasitic pnp transistor caused at the time when the npn transistor operates in the saturation range to thereby enhance its reliability.

This object can be achieved by a $p^+$-type impurity region which, instead of $n^+$-type guard ring 7' shown in FIGS. 2A and 2B, is formed in the upper portion of an $n^-$-type collector region in a npn bi-polar transistor to form electrodes in such a way that the $p^+$-type impurity region and the $n^-$-type collector region are short-circuited electrically.

DETAILED DESCRIPTION OF THE PREFERRED EMBODIMENT

Figure 1A:
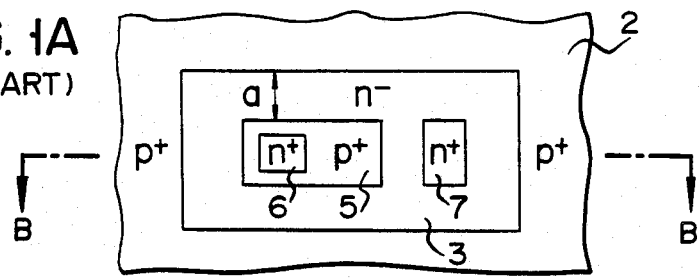
FIG. 1A is a plan view showing a typical npn bi-polar transistor section in the conventional semiconductor device.
Figure 1B:
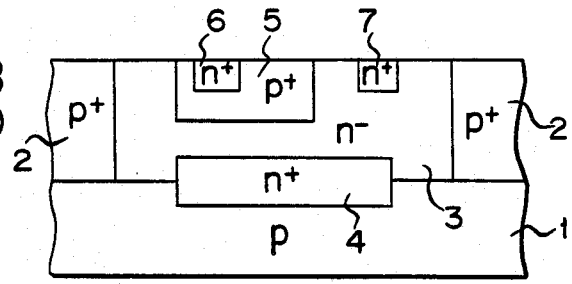
FIG. 1B is a sectional view taken along a line B—B in FIG. 1A.
Figure 2A:
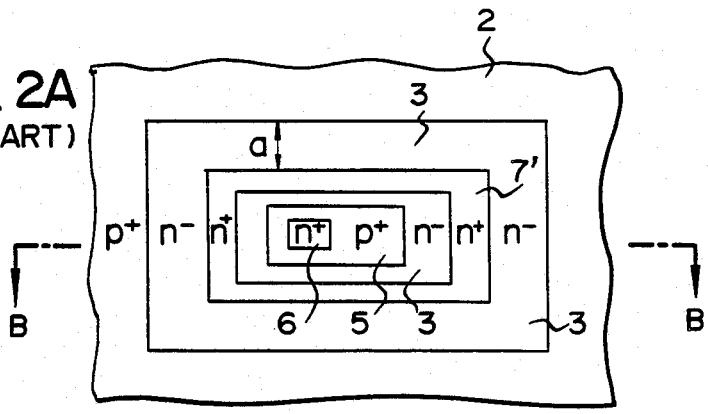
FIG. 2A is a plane view showing an improved npn bi-polar transistor section in the conventional semiconductor device.
Figure 2B:
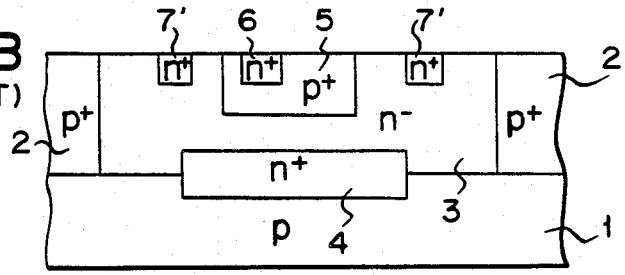
FIG. 2B is a sectional view taken along a line B—B in FIG. 2A.
Figure 3A:
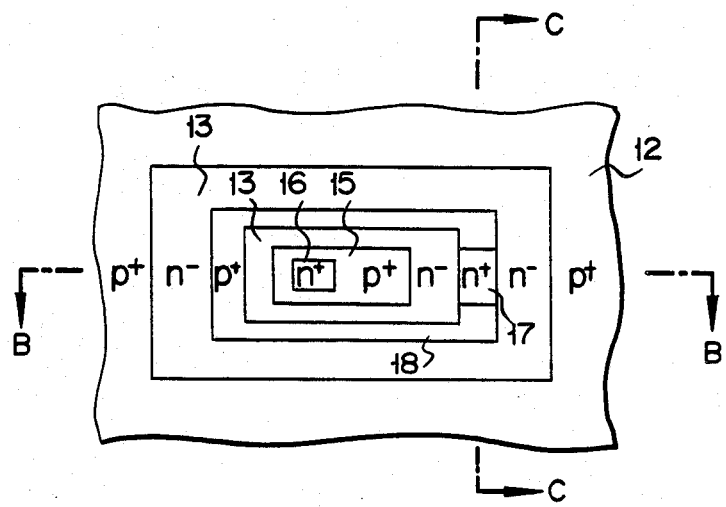
FIG. 3A is a plane view showing the npn bi-polar transistor in an example of a semiconductor device according to the present invention.
Figure 3B:
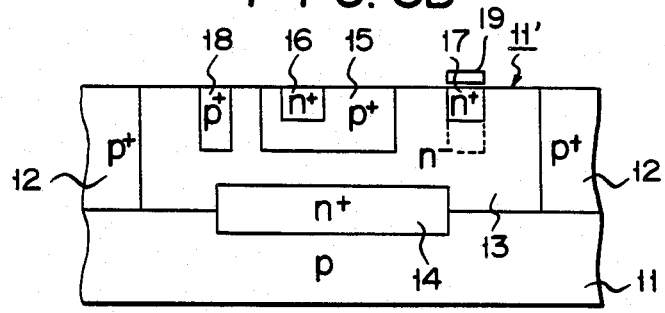
FIG. 3B is a sectional view taken along a line B—B in FIG. 3A.
Figure 3C:
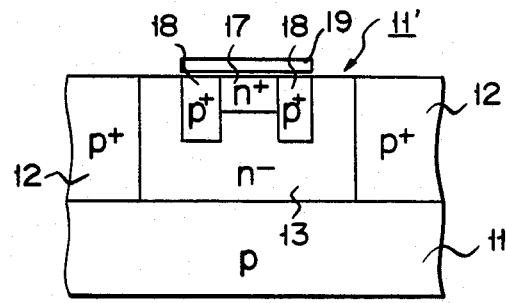
FIG. 3C is a sectional view taken along a line C—C in FIG. 3A.

Referring to FIGS. 3A, 3B and 3C, a preferred embodiment of the present invention will be now described.

Reference numeral 11 represents a p-type silicon substrate. An n⁻-type epitaxial silicon layer 11' is formed on the p-type substrate 11. A p⁺-type isolation diffusion layer 12 having an impurity concentration of $3 \times 10^{19}/cm^3$ is formed in the n⁻-type epitaxial layer 11', connecting with the p-type substrate 11. An n⁻-type collector region 13 of the npn transistor is isolated by the p⁺-type isolation diffusion layer 12. An n⁺-type buried layer 14 having an impurity concentration of $1 \times 10^{20}/cm^3$ is formed between the n⁻-type collector region 13 and the p-type substrate 11. On the other hand, a p⁺-type base region 15 having an impurity concentration $5 \times 10^{18}/cm^3$ is formed in the upper portion of n⁻-type collector region 13, while an n⁺-type emitter region 16 having an impurity concentration of $1 \times 10^{20}/cm^3$ is formed in the upper portion of p⁺-type base region 15. In addition to the p⁺-type base region, an n⁺-type region for forming a collector electrode and having an impurity concentration of $1 \times 10^{20}/cm^3$ is also formed in the upper portion of n⁻-type collector region 13. So far, the npn transistor section of the present invention is identical with that of the conventional semiconductor device.

In the case of the preferred embodiment of the present invention, a p⁺-type impurity region 18 having an impurity concentration of $5 \times 10^{18}/cm^3$ is further formed, in the outer layer of the n⁻-type collector region, between the p⁺-type base region 15, and the p⁺-type isolation diffusion layer 12, enclosing the p⁺-type base region 15. Region 18 is formed in contact with the n⁺-type region 17.

Furthermore, the surface of the epitaxial layer 11' is covered by an insulating film (not shown), on which are formed an emitter electrode ohmic-contacted with the n⁺-type emitter region 16 through a contact hole and a base electrode ohmic-contacted with the p⁺-type base region 15 through a contact hole. On the insulating film is also formed a collector electrode ohmic-contacted with the n⁺-type region 17 for forming the collector electrode and the p⁺-type impurity region 18 through contact holes. The n⁻-type collector region 13 and p⁺-type impurity region 18 are electrically short-circuited through this collector electrode.

The dimension of each of regions in the npn transistor shown in FIGS. 3A is as follows:

n⁺-type emitter region 16; $16 \mu m \times 16 \mu m \sim 20 \mu m \times 20 \mu m$ width of p⁺-type base region 15; $4 \mu m$ at narrow portion and $24 \sim 28 \mu m$ at wide portion distance between the p⁺-type base region 15 and the p⁺-type impurity region 18; $10 \mu m$ width of p⁺-type impurity region 18; $10 \mu m$ distance between the p⁺-type impurity region 18 and the p⁺-type isolation diffusion layer 12; $20 \mu m$.

Two kinds of parasitic pnp transistors which perform parasitic operation at the time of operation in the saturation range are present in the npn transistor section of semiconductor device having such arrangement as described above. One of them is a pnp transistor similar to the conventional one and in which the p⁺-type base region 15 functions as emitter, the n⁻-type collector region 13 as base, and the p-type substrate 11 and p⁺-type isolation diffusion layer 12 as collector. The other is a parasitic pnp transistor in which the p⁺-type base region 15 functions as emitter, the n⁻-type collector region 13 as base, and the p⁺-type impurity region as collector. There is also present a third parasitic pnp transistor in which p⁺-type impurity region 18 functions as emitter, the n⁻-type collector region 13 as base, and the p⁺-type isolation diffusion layer 12 and p-type substrate 11 as collector. As already described above, however, the p⁺-type impurity region 18 and n⁻-type collector region 13 are short-circuited by the collector electrode 19 (FIGS. 3B and 3C) and the third parasitic pnp transistor performs no operation because its base and emtter are short-circuited.

The second parasitic pnp transistors, in which the p⁺-type impurity region 18 functions as a collector, has a value $h_{FE}$ which is extremely larger as compared with $h_{FE}$ of the first parasitic pnp transistor. Therefore, the second parasitic transistor has priority upon operating in the saturation range of the npn transistor. All of the current caused by the operation of the second parasitic transistor therefore flows into the p⁺-type impurity region 18 which functions as a collector. Since the p⁺-type impurity region 18 is ohmic-contacted with the collector electrode (not shown), all of the current caused by the operation of the second parasitic pnp transistor flows to the collector electrode but not to the p-type substrate 11.

Figure 4:
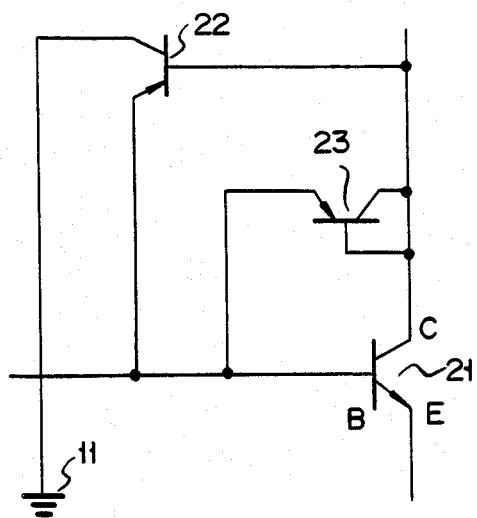
FIG. 4 is a equivalent circuit diagram corresponding to the npn bi-polar transistor section shown in FIGS. 3A, 3B and 3C.

This will be now described in more detail referring to FIG. 4. Reference numeral 21 represents an npn transistor, 22 the first parasitic pnp transistor, and 23 the second parasitic pnp transistor. As described above, current can be completely prevented from flowing to the p-type substrate 11 as long as only the second parasitic pnp transistor 23 operates preferentially, even if the npn transistor 21 is operated in the saturation range. And even if the first parasitic transistor 22 operates causing current to flow to the substrate 11, current flowing to the substrate 11 can be remarkably suppressed because the second parasitic transistor 23 is also always operating in this case. In the case of a conventional semiconductor device in which no second parasitic transistor 23 is present, however, when the npn transistor 21 operates in the saturation range, the first parasitic transistor 22 begins to operate immediately thereafter, thus causing a large amount of current to flow to the p-type substrate 11.

Figure 5:
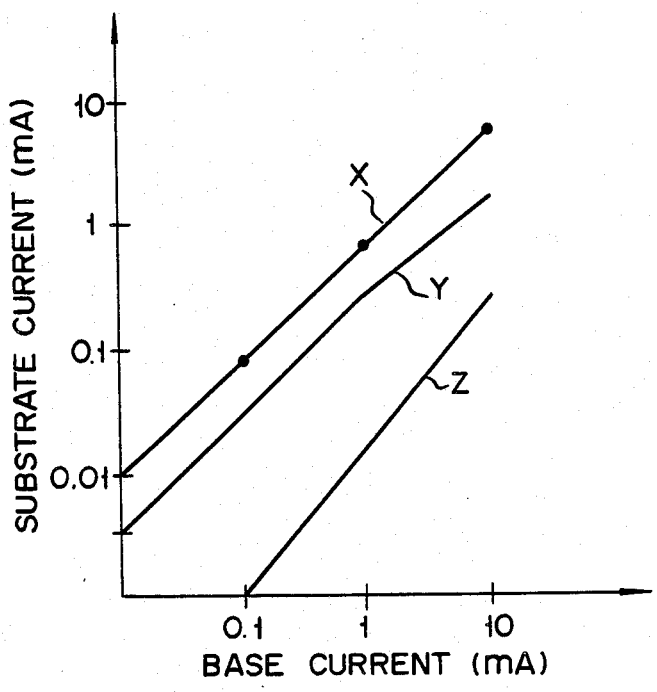
FIG. 5 is a graph used to explain the effect attained by the preferred embodiment of the present invention shown in FIGS. 3A, 3B and 3C.

FIG. 5 shows a comparison of relation between currents flowing to the side of the substrate and base currents measured when npn transistors shown in FIGS. 1A, 1B, 2A and 2B and in the preferred embodiment of the present invention are operated in the saturation range. Symbol X shows the results of measurements on the semiconductor device shown in FIGS. 1A and 1B, and symbol Y results of measurements on the semiconductor device shown in FIGS. 2A and 2B. Symbol Z shows results of measurements on the semiconductor device of the present invention. As is apparent from these measurement results, the semiconductor device of the embodiment mentioned above enables current flowing to the side of a substrate at the time when the an npn transistor operates in saturation range to be reduced to an extremely greater extent as compared with conventional semiconductor devices, thus remarkably enhancing the reliability of device.

In the above-described embodiment of the present invention, the p⁺-type impurity region 18 itself may be formed in a closed ring and the n⁺-type region 17 for forming the collector electrode may be formed contacting with a part of the inner or outer side of this p+-type impurity region 18.

It is not always necessary that the p+-type impurity region 18 be formed enclosing the p+-type base region 15, but a certain effect can be achieved even when the p+-type impurity region 18 is limited only at a portion at which it is in contact with the n+-type region for forming the collector electrode.

In any cases, however, both of p+-type impurity region 18 and n−-type collector region 13 must be electrically short-circuited. As long as this requirement is satisfied, the n+-type region for forming the collector electrode may not be formed when the impurity concentration of collector region 13 is so high as to allow the collector region 13 to ohmic-contact the collector electrode.

It should be therefore understood that the present invention is not limited to the above-described embodiment but only by the claims appended hereto.

What is claimed is:

1. A semiconductor device comprising:
a p-type semiconductor substrate;
an n-type semiconductor layer formed on the upper surface of said p-type semiconductor substrate;
a p-type isolation diffusion layer formed to extend from the upper surface of said p-type semiconductor substrate to the upper surface of said n-type semiconductor layer to form an n-type collector region in said n-type semiconductor layer which is isolated by said p-type isolation diffusion layer;
a p-type base region formed in an upper surface of said n-type collector region;
an n-type emitter region formed in an upper surface of said base region;
a p-type impurity region formed in an upper surface of said n-type collector region between said p-type base region and said p-type isolation layer, said p-type impurity region substantially surrounding said p-type base region and forming an open loop;
a high concentration n-type region for forming a collector electrode in the upper surface of said n-type collector region, said high concentration n-type region contacting said p-type impurity region to close said open loop such that said n-type region and said p-type impurity region form a closed loop, said high concentration n-type region not comprising a portion of any high concentration n-type closed loop surrounding said p-type base region; and
a collector electrode formed in contact with both said p-type impurity region and said high concentration n-type region.

* * * * *